(12) United States Patent
Iizuka

(10) Patent No.: US 6,396,646 B2
(45) Date of Patent: May 28, 2002

(54) MULTI-BEAM OPTICAL SYSTEM

(75) Inventor: Takashi Iizuka, Saitama-ken (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/739,116

(22) Filed: Dec. 19, 2000

(30) Foreign Application Priority Data

Dec. 21, 1999 (JP) ............................................ 11-362082

(51) Int. Cl.$^7$ ............................................. G02B 26/08
(52) U.S. Cl. ....................... 359/726; 359/204; 359/208; 359/212; 359/216; 359/558; 359/618
(58) Field of Search ................................ 359/196–226, 359/618, 619, 558, 563, 566, 569, 726–731, 305; 347/233, 241, 243, 244

(56) References Cited

U.S. PATENT DOCUMENTS 5,657,121 A * 8/1997 Nishina ....................... 356/327

* cited by examiner

Primary Examiner—James Phan
(74) Attorney, Agent, or Firm—Greenblum & Bernstein, P.L.C.

(57) ABSTRACT

A multi-beam optical system has a beam-dividing element that divides a light beam emitted by a light source into a plurality of light beams, which are emerged therefrom at different angles, respectively. A propagation optical system, through which the divided light beams propagate, includes a plurality of curved surface mirrors, and an image-forming optical system that forms a plurality of beam spots on an objective surface by converging the light beams propagated through the propagation optical system. In such an optical system, the curved mirrors are arranged such that the affection of the mirrors on the alignment of the beam spots is accumulatively cancelled.

9 Claims, 7 Drawing Sheets

MULTI-BEAM OPTICAL SYSTEM

BACKGROUND OF THE INVENTION

The present invention relates to a multi-beam optical system that divides a beam received from a light source into a plurality of beams, which are directed to an objective surface. More particularly, the present invention relates to the multi-beam optical system employing curved surface mirrors.

The multi-beam optical system of the above-described type has been known. An example of such an optical system is employed in a beam scanning imaging device for forming circuitry patterns of semiconductor elements. The multi-beam imaging device scans a plurality of beam spots on an objective surface simultaneously to form a plurality of scanning lines on the surface at one scanning operation. Thus, the circuitry pattern can be formed efficiently.

Meanwhile, in the field of semiconductor elements, fine resolution circuit patterns are preferred in order to increase circuitry density and downsize each element. In order to form a fine resolution image, it is preferable to use a light source, which emits light having a relatively short wavelength. Therefore, recently, a light source emitting an ultraviolet laser beam becomes widely used. Since optical glasses generally absorb the ultraviolet light, and lowers the quantity of the light beam on the objective surface, it is preferable to replace at least some glass lenses with curved surface mirrors. In this case, since the incident light beams and the reflected light beams should be spatially separated, each of the curved surface mirrors should be arranged such that the optical axis thereof is inclined with respect to the optical path of the incident beams. With this arrangement, a predetermined separation angle is formed between the incident beam and the reflected beam.

If curved surface mirrors are included in the multi-beam optical system, however, due to the separation of the optical paths of the incident beams and reflected beams, a problem indicate below arises.

That is, in the multi-beam scanning device, linearly aligned plurality of beam spots (which will be referred to as a beam spot array) should be formed on the objective surface. If a plurality of beams, which are linearly and evenly arranged on plane perpendicular to the optical path of the beams, are incident on a curved surface mirror from a direction inclined to the optical axis of the curved surface mirror, the reflected beams are curvedly arranged on a plane perpendicular to the optical path of the beams. As a result, the scanning lines formed on the objective surface may be unevenly arranged.

FIG. 13 schematically shows the arrangement of the beam spots on the objective surface using five beams. Spots indicated by solid lines are ideally arranged, i.e., arranged linearly and evenly. On the contrary, spots indicated by broken lines are exemplary arrangement of the actually formed beam spots, which are arranged unevenly and curvedly.

SUMMARY OF THE INVENTION

It is therefore an object of the present invention to provide an improved multi-beam optical system capable of preventing curved arrangement of beam spots on an objective surface even though it includes curved surface mirrors.

For the above object, according to the present invention, there is provided a multi-beam optical system, which is provided with a light source that emits a light beam, a beam-dividing element that divides the light beam emitted by the light source into a plurality of light beams which emanate therefrom at different angles, respectively, a propagation optical system through which the divided light beams propagate, the propagation optical system including a plurality of curved surface mirrors, and an image-forming optical system that forms a plurality of beam spots on an objective surface by converging the light beams propagated through the propagation optical system. In such an optical system, the condition indicated by the following equation is satisfied:

$$\sum_{i=1}^{n} A_i \theta_i \frac{\omega_0}{\omega_i} = 0,$$

where, i represents a mirror number of the plurality of curved surface mirrors counted along a direction where the divided light beams propagate, n represents the number of the plurality of curved surface mirrors.

$\theta i$ represents an inclination angle of an optical axis of an i-th curved surface mirror with respect to a central axis of a rectilinearly proceeding beam which would not be deflected by the beam-dividing optical element and proceed rectilinearly, Ai represents a coefficient for an i-th curved surface mirror, Ai being +1 when a particular beam of the divided light beams is on one side with respect to a central axis of the rectilinearly proceeding beam, Ai being −1 when the particular beam of the divided light beams is on the other side with respect to the central axis of the rectilinearly proceeding beam, $\omega_0$ is a diameter of the particular beam emerged from the beam-dividing optical element, and $\omega i$ represents a diameter of the particular beam at the i-th curved surface mirror.

With this configuration, curvature of alignment of the beam spots given by each curved surface mirror is accumulatively cancelled. Therefore, the beam spots can be aligned along a straight line on the objective surface. It should be noted that the condition need not be precisely satisfied, but should merely be satisfied substantially. That is, a slight curvature of the alignment, which is negligible in view of the application of the multi-beam optical system, is allowable.

Optionally, the multi-beam optical system may include a scanning system that deflects the plurality of light beams converged by the propagation optical system to scan with respect to the objective surface. In this regard, even if the condition is not precisely satisfied, if the curvature of the alignment of the beam spots does not affect the pitch between the scanning lines formed by the respective light beams, the object of the invention is achieved.

Preferably, the plurality of curved surface mirrors are arranged between the beam-dividing optical element and the scanning system.

In particular, the scanning system includes a polygonal mirror that is rotated to deflect the plurality of light beams.

Further optionally, the propagation optical system may include a multi-channel modulator that independently modulates each of the light beams divided by the beam-dividing element, and the plurality of curved surface mirrors are arranged between the beam-dividing element and the multi-channel modulator. The multi-channel modulator may be a multi-channel AOM (acousto-optic modulator).

In a particular case, the plurality of curved surface mirrors consist of an odd number of curved surface mirrors, each of the curved surface mirrors having a positive power.

In this case, it is preferable that a distance between the beam-dividing optical system and a first mirror, which is arranged closest to the beam-dividing optical system, of the plurality of curved surface mirrors coincides with a focal length of the first mirror, and a distance between an i-th curved surface mirror and an (i-1)-th mirror coincides with a sum of focal lengths of the i-th mirror and the (i-1)-th mirror.

In a particular case, the beam-dividing optical element includes a diffractive beam-dividing element.

BRIEF DESCRIPTION OF THE ACCOMPANYING DRAWINGS

FIG. 1 shows a part of a scanning optical system employing a multi-beam optical system according to the invention;

FIG. 2 schematically shows a developed arrangement of optical elements along an auxiliary scanning direction;

Figure 5:
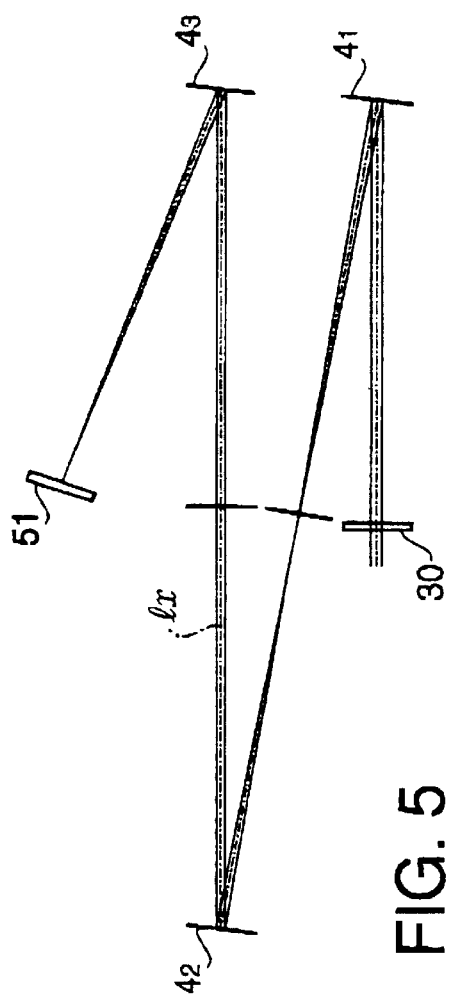
Figure 6:
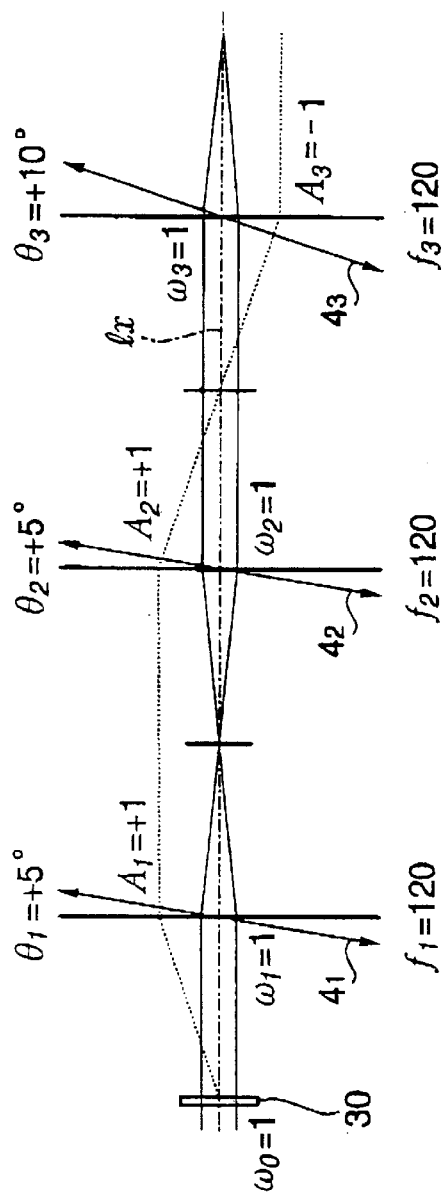
Figure 7:
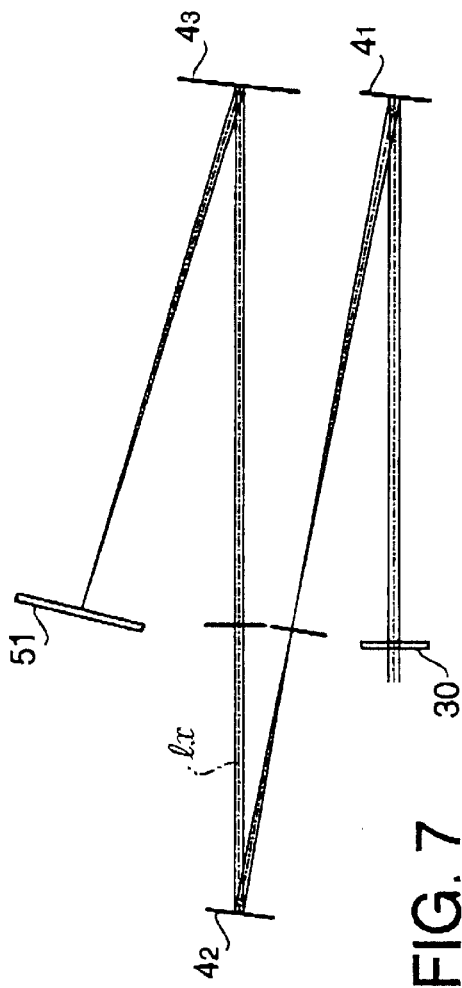
Figure 8:
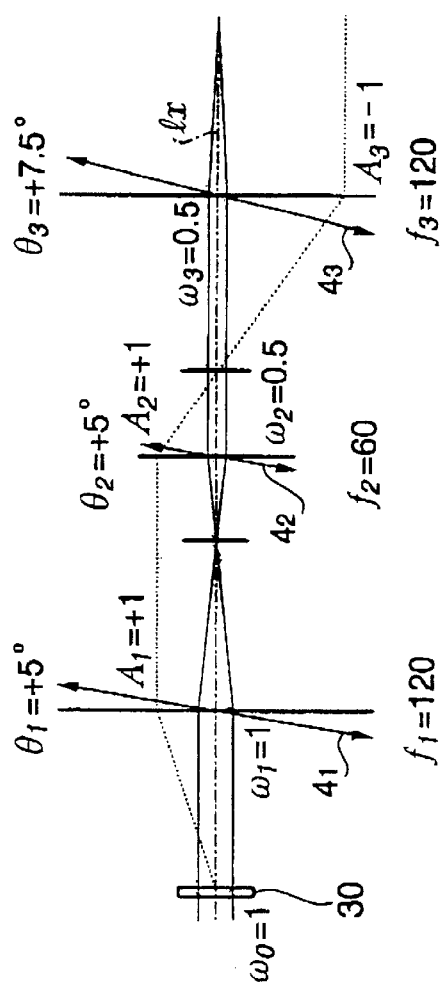
Figure 9:
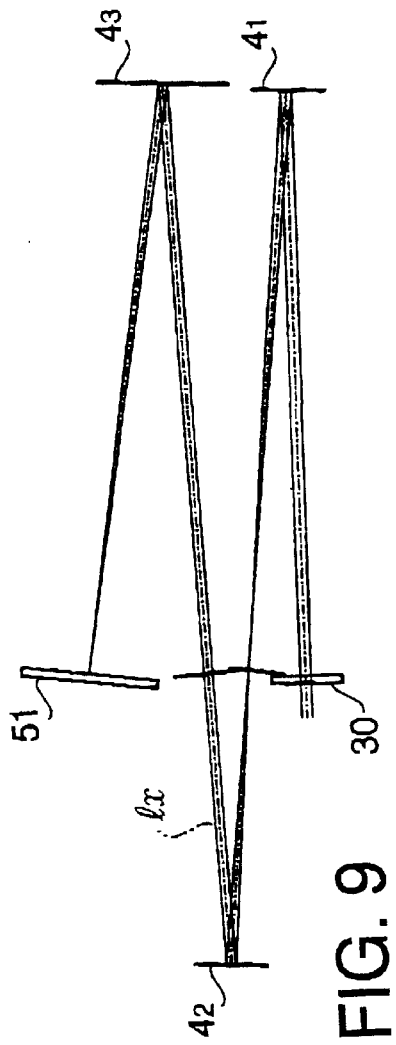
Figure 10:
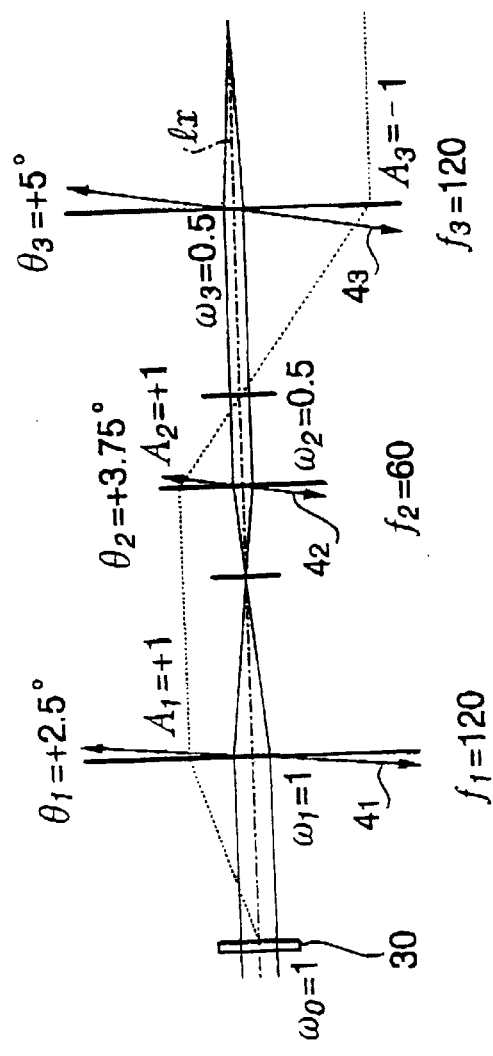
Figure 11:
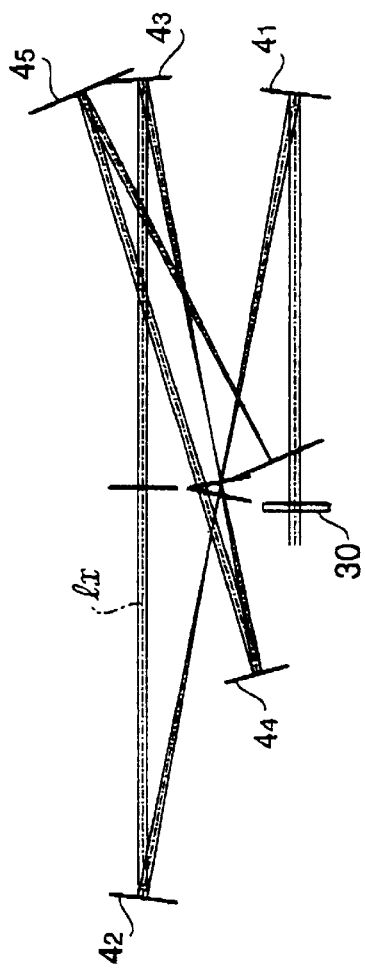
Figure 12:
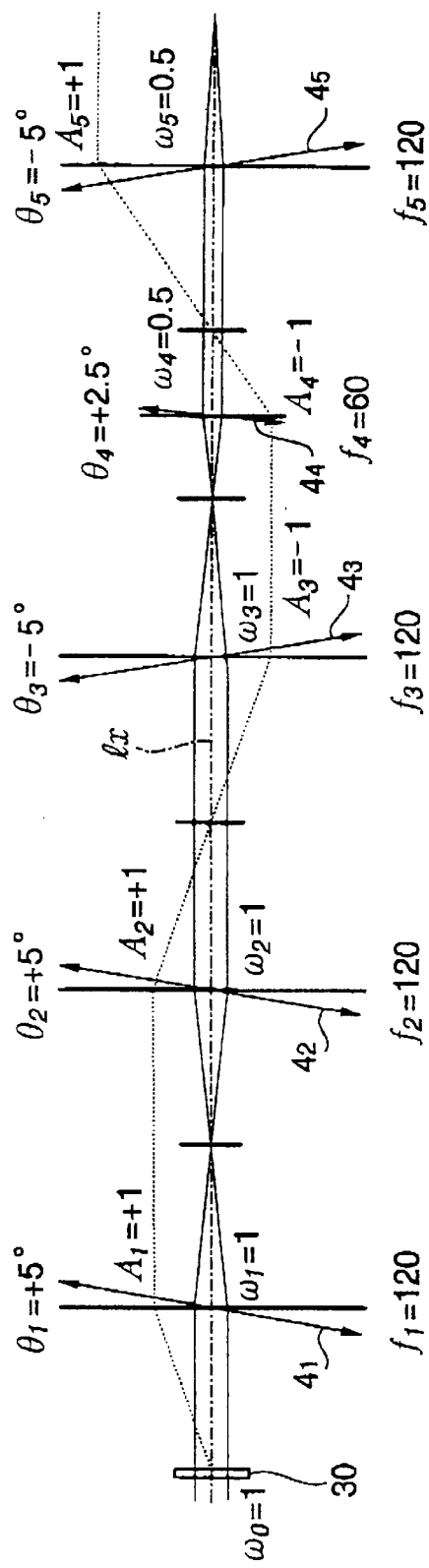
Figure 13:
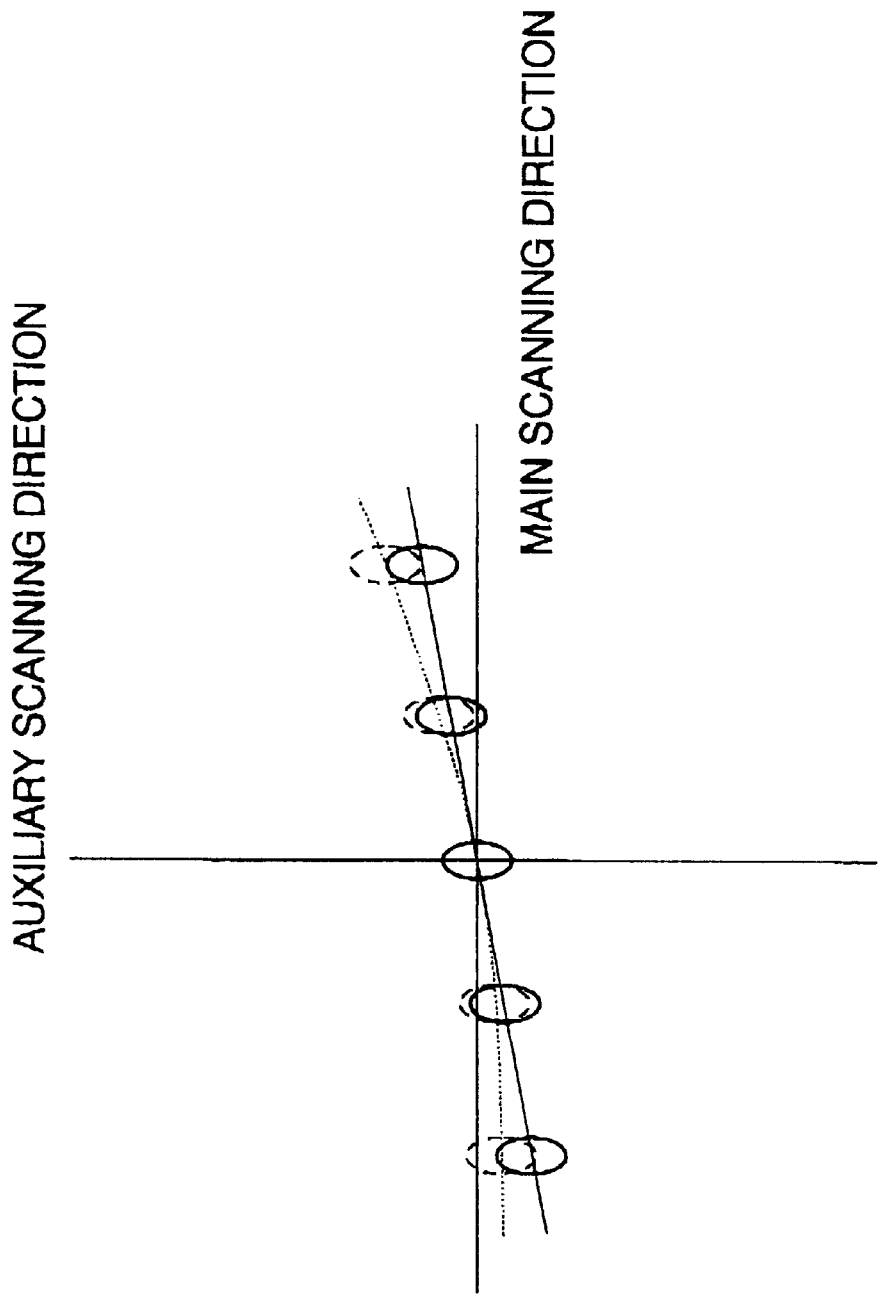

FIG. 5 schematically shows an optical structure of a converging optical system according to a first embodiment;

FIG. 6 shows inclination angles $\theta_1$, beam diameters $\omega_1$ and concrete values $A_1$ of a converging optical system according to the first embodiment;

FIG. 7 schematically shows an optical structure of a converging optical system according to a second embodiment;

FIG. 8 shows inclination angles $\theta_1$, beam diameters $\omega_1$ and concrete values $A_1$ of a converging optical system according to the second embodiment;

FIG. 9 schematically shows an optical structure of a converging optical system according to a third embodiment;

FIG. 10 shows inclination angles $\theta_1$, beam diameters $\omega_1$ and concrete values $A_1$ of a converging optical system according to the third embodiment;

FIG. 11 schematically shows an optical structure of a converging optical system according to a fourth embodiment;

FIG. 12 shows inclination angles $\theta_1$, beam diameters $\omega_1$ and concrete values $A_1$ of a converging optical system according to the fourth embodiment; and FIG. 13 illustrates curvedly arranged beam spots due to inclination of a curved mirror surface.

DESCRIPTION OF THE EMBODIMENTS

Hereinafter, multi-beam optical systems according to embodiments of the present invention will be described with reference to the accompanying drawings.

Figure 1:
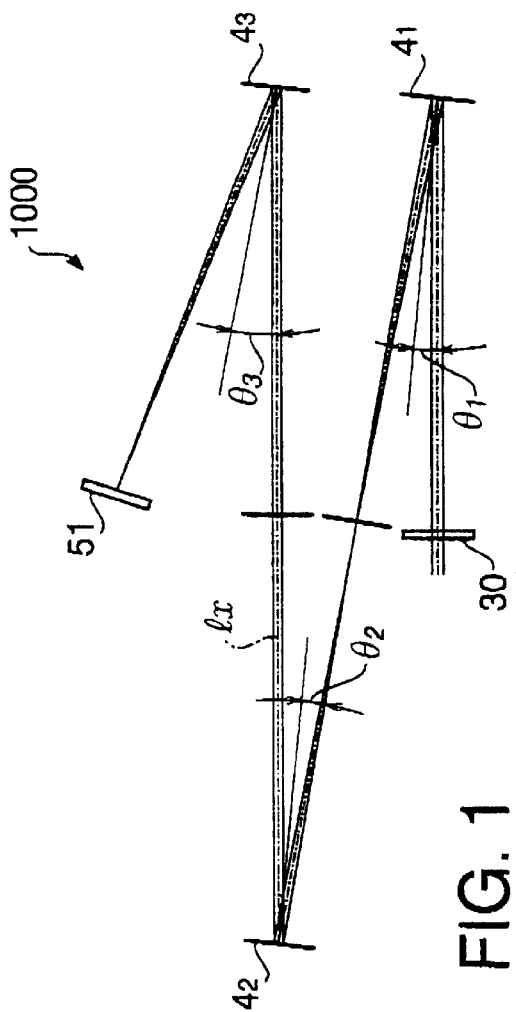
Figure 2:
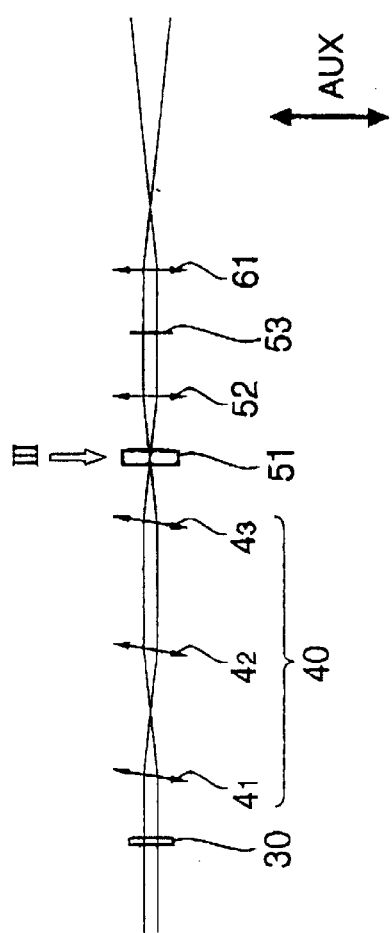
Figure 3:
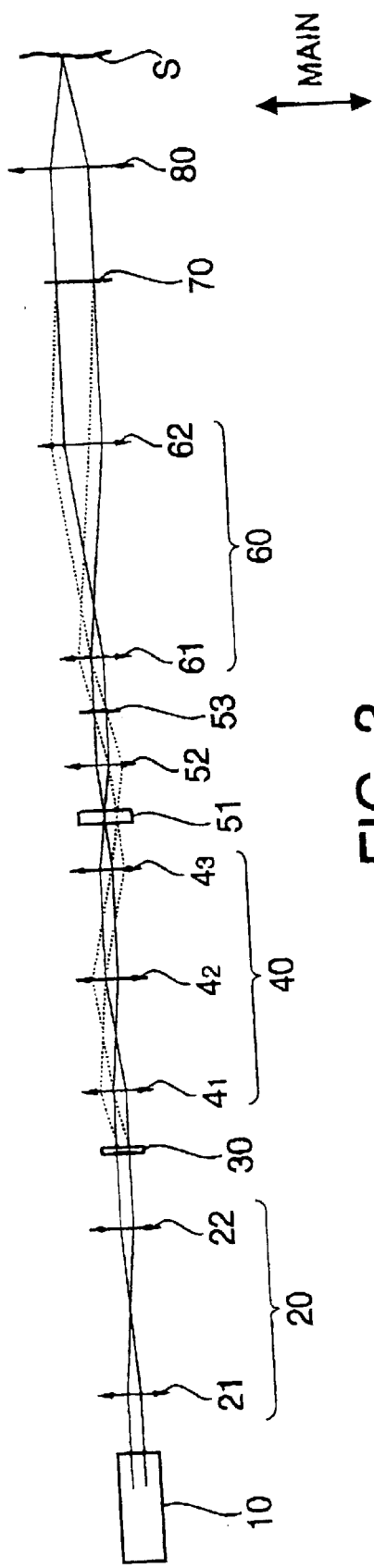
FIG. 3 shows a developed arrangement of an optical elements of the multi-beam optical system along a main scanning direction.
Figure 4:
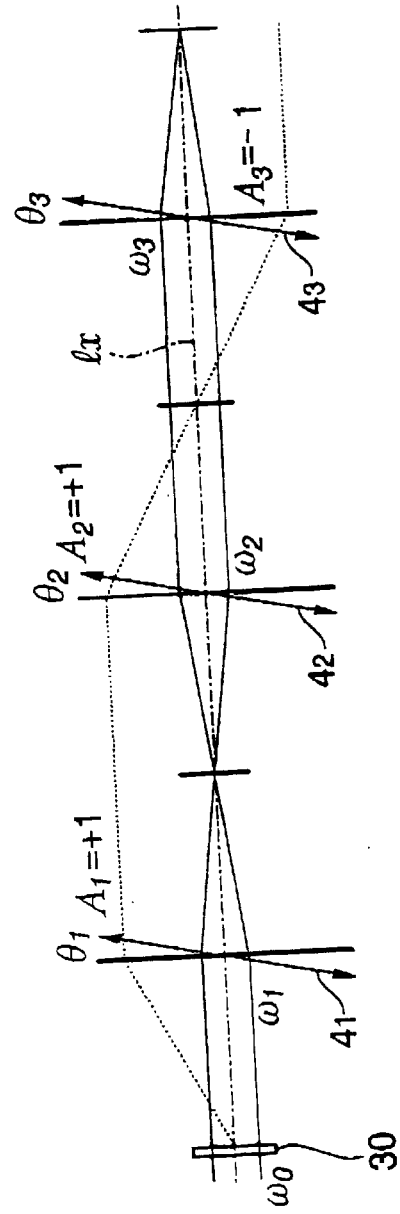
FIG. 4 is a diagram illustrating inclination angles $\theta_1$, beam diameters $\omega_1$ and concrete values $A_1$ of a converging optical system.

FIG. 1 shows a part of a scanning optical system 1000 embodying the invention. FIG. 2 is a developed view of a part of the scanning optical system 1000. FIG. 3 shows an entire structure of the scanning optical system 1000 viewed along arrow III of FIG. 2. FIG. 4 shows inclination angles of curved surface mirrors employed in the scanning optical system 1000. In FIGS. 1–4, each optical element is shown as a thin system. Further, in FIG. 4, the inclination angles of the optical elements are shown as angles with respect to an incident beam on a plane parallel with the surface of the drawing. It should be noted that, since FIG. 4 is a developed view, the inclination of the optical elements with respect to the reflected beam cannot be indicated.

The scanning optical system 1000 includes, as shown in FIGS. 2 and 3:

a laser source 10 that emits an ultraviolet laser beam;

a beam expander 20 that adjusts a diameter of the laser beam emitted by the laser source 10;

a diffractive beam-dividing element 30 that diffracts the parallel laser beam emerged from the beam expander 20 to divide the beam into a plurality of separate beams which are directed at different diffraction angles;

a converging optical system 40 that converges the divided light beams such that the principal rays of the beams are aligned in parallel;

a multi-channel AOM (Acousto-Optic Modulator) 51 arranged at a beam waist position of the light beams emerged from the converging optical system 40;

a collimating lens 52 that collimates each of the divided light beams passed through the AOM 51;

a piezoelectric mirror 53 arranged at an exit pupil position of the collimating lens 52;

a relaying lens 60 that relays the beams reflected by the piezoelectric mirror 53;

a polygonal mirror 70 for deflecting the beams relayed by the relaying lens 60, a reflection surface reflecting the beams emerged from the relaying lens 60 and the piezoelectric mirror 53 having a conjugate relationship with respect to the relaying lens 60; and a scanning lens 80 that converges the beams deflected by the polygonal mirror 70 on an objective surface S to form a plurality of beams spots thereon.

The polygonal mirror 70 revolves about a rotation axis which extends in an up-and-down direction in FIG. 2 (i.e., in a direction substantially perpendicular to the surface of FIG. 3) to deflect the beams. Therefore, in the following description, the up-and-down direction of FIG. 2 is referred to as an auxiliary scanning direction (which is indicated by arrow AUX). Further, the objective surface S moves in an up-and-down direction in FIG. 2 while the beams scan in the main scanning direction. Accordingly, the up-and-down direction in FIG. 3 is referred to as a main scanning direction (which is indicated by arrow MAIN).

The laser source 10 emits the ultraviolet laser beam as a parallel light beam. The beam expander 20 is an afocal system as a whole, and emerges the laser beam with adjusting the diameter of the beam.

The diffractive beam-dividing element 30 is constructed such that a diffractive grating, including a multiplicity of fine rectangular reference phase patterns, are formed on one surface of a transparent base plate. The diffractive beam-dividing element 30 is arranged/formed such that a grating vector is rotated clockwise by approximately 80 degrees with respect to the auxiliary scanning direction AUX. With this configuration, a beam spot array (i.e., an array of linearly aligned beam spots) on the objective surface S is rotated clockwise by approximately 60 degrees with respect to the auxiliary scanning direction, as shown in FIG. 13 by solid lines.

The diffractive beam-dividing element 30 diffracts the incident laser beam to divide it, in the direction of the grating vector, into a plurality of separate beams that are emerged at different diffraction angles. In FIG. 3. a non-diffracted beam (i.e., a 0th order beam) is illustrated by a solid line and one of diffracted beams (e.g., +1st order diffraction component) is illustrated by a broken line. Hereinafter, a central axis of the 0th order beam will be referred to as a central axis lx.

The converging optical system 40 includes an odd number n, which is three or more, of curved surface mirrors $4_1$ (a first curved surface mirror), $4_2$ (a second curved surface mirror), $4_3$ (a third curved surface mirror), ... $4_n$ (an n-th curved surface mirror). The first curved surface mirror $4_1$ is arranged such that, on the central axis lx, a distance from the diffractive beam-dividing element 30 coincides with a focal length $f_1$ thereof. The second curved surface mirror $4_2$ is arranged such that, on the central axis lx having been bent by the first mirror $4_1$, a distance from the first curved surface mirror $4_1$ coincides with a sum of the focal lengths $f_1$ and $f_2$ of the first and second curved surface mirror $4_1$ and $4_2$. Similarly, an i-th curved surface mirror $4_1$ is arranged such that, on the central axis lx having been bent by an (i-1)-th mirror $4_{(i-1)}$, a distance from the (i-1)-th curved surface mirror $4_{(i-1)}$ coincides with a sum of the focal lengths $F_{(i-1)}$ and $F_1$ of the (i-1)-th and i-th curved surface mirror $4_{(i-1)}$ and $4_1$. In the following description, an angle of the optical axis of the i-th curved surface mirror $4_1$ with respect to the central axis lx will be indicated as $\theta_1$, which will also be referred to merely as an inclination angle of the i-th curved surface mirror $4_1$. It should be noted that, in this specification, the optical axis of a curved surface mirror is defined as an axis connecting the center of the curved surface and its center of curvature. The inclination angle $\theta i$ is indicated to be positive when the optical axis of the i-th curved surface mirror $4_1$ inclines in the upper side of FIG. 1 in the auxiliary scanning direction (or, in the direction perpendicular to the grating vector), and to be negative when the optical axis of the i-th curved surface mirror $4_1$ inclines in the lower side of FIG. 1

As shown in FIG. 4, between the first curved surface mirror 41 and the second curved surface mirror 42, the central axis of each beam is parallel with the central axis lx. Therefore, each beam is converged at a position, a distance of which with respect to the first curved surface mirror $4_1$ is the same as the focal length $F_1$ of the first curved surface mirror $4_1$, and then is incident on the second curved surface mirror $4_2$ as a diverging light beam. Accordingly, a diameter $\omega_2$ of each beam at the second curved surface mirror $4_2$ is $F_2/F_1$ times the diameter $\omega_1$ of the beam incident on the first curved surface mirror $4_1$. Between the second and third curved surface mirrors $4_2$ and $4_3$, each beam proceeds as a parallel light beam. Each beam intersects the central axis lx at a point, which is spaced from the second curved surface mirror $4_2$ by its focal length, $f_2$. Therefore, the diameter $\omega_3$ of each beam at the third curved surface mirror $4_3$ is equal to the diameter $\omega_2$ of each beam at the second curved surface mirror $4_2$. On the downstream side of the third curved surface mirror $4_3$, the central axis of each beam is parallel with the central axis lx, and each beam is converged at a position, a distance of which with respect to the third curved surface mirror $4_3$ is the same as the focal length $F_3$ of the third curved surface mirror $4_3$. Thus, the beams reflected by the third curved surface mirror $4_3$ are converged on the position where the AOM 51 is located.

In summary, if the converging optical system consists of curved surface mirrors, the central axis of the beams are parallel with the central axis lx between the odd-numbered and even-numbered curved surface mirrors. Each beam is once converged at a point which is spaced from the odd-numbered curved surface mirror by the focal length thereof, and then incident on the even-numbered curved surface mirror. The diameter of each beam incident on the even-numbered curved surface mirror is (the focal length of the even-numbered curved surface mirror)/(the focal length of the odd-numbered curved surface mirror) times the diameter of the odd-numbered curved surface mirror. Between the even-numbered curved surface mirror and the odd-numbered curved surface mirror, each beam proceeds as a parallel light beam. Each beam intersects with the central axis lx at a position spaced from the even-numbered curved surface mirror by the focal length of the even-numbered curved surface mirror.

The AOM 51 is arranged at a position on the central axis lx having been bent by the third curved surface mirror $4_3$ and spaced therefrom by the focal length $f_3$ thereof. The multi-channel AOM 51 has a plurality of channels respectively corresponding to the beams converged by the converging optical system 40. The multi-channel AOM 51 is configured such that a diffracted/non-diffracted beam is emerged from each channel depending on an input ultrasonic wave for each channel. Therefore, by controlling the input ultrasonic wave for each channel, one of the non-diffracted beam, which proceeds straight through the channel, or the diffracted beam can be used as a modulated beam. Since such a control can be performed for each channel, each beam can be modulated independently.

The collimating lens 52 is arranged at a position, on the central axis lx, at which the front focal point thereof coincides with the multi-channel AOM 51. The beams emerged from the collimating lens 52 are collimated beams, and the central axes of the emerged beams intersects with the center axis lx at the rear focal point of the collimating lens 52.

The piezoelectric mirror 53 is arranged at a position where the central axes of the beams passed through the collimating lens 52 intersect with each other. The piezoelectric mirror 3 reflects each beam. It should be noted that the reflection angles of the beams can be changed in accordance with the inclination of the reflection surface of the polygonal mirror 70 to compensate for facet error of the polygonal mirror 70.

The relaying lens 60 is an afocal optical system as a whole, and includes a first lens 61 and a second lens 62. The first lens 61 is arranged at a position, on the central axis lx having been bent by the piezoelectric mirror 53, such that the front focal point thereof coincides with the piezoelectric mirror 53. The second lens 62 is arranged, on the central axis lx, such that the front focal point thereof coincides with the rear focal point of the first lens 61.

By the relay lens system 60, each beam is expanded at a ratio of (the focal length of the second lens 62)/(the focal length of the first lens 61), and is incident on the polygonal mirror 70 located at the rear focal point position of the second lens 62 as parallel light beams, the incident beams having evenly distributed angular differences with respect to the central axis lx.

The polygonal mirror 70 rotates about its rotation axis so that the beams are deflected in the main scanning direction with the evenly distributed angular differences, in the auxiliary direction, of the beams being maintained.

The scanning lens 80 has an $f\theta$ characteristic, and converges the beams reflected by the polygonal mirror 70 to form beam spots on the objective surface S. It should be noted that the beam spots are arranged on a straight line, evenly spaced from each other in the auxiliary scanning direction, and are scanned in the main scanning direction at a constant speed.

Since the ultraviolet beams are used in the optical scanning device 1000, it is preferable that the number of refractive lenses included in the propagation optical system from the beam expander 20 through the scanning lens 80 is reduced, in view of avoidance of the loss of light due to absorption characteristics of the lenses. According to the embodiment, therefore, the beam expander 20 and the converging optical system 40 consist of the curved surface mirrors. It should be noted that, since the converging optical system 40 is arranged on the downstream side of the diffractive beam-dividing element 30, the inclination of the optical axes of the mirrors with respect to the central axis lx causes the beam spot array to bend (i.e., the beam spots area aligned on a curved line). In order to avoid such a problem, the inclination of each mirror of the converging optical system 40 are determined to satisfy conditions described below so that the beam spots are aligned on a straight line on the objective surface S.

Given that a coefficient Ai related to the i-th mirror is defined such that Ai=+1 if INT{(i−1)/2} is an even number, and that Ai=−1 if INT{(i−1)/2} is an odd number. Note that INT{A/B} is a function which gives an integer part of a quotient of A divided by B. Thus, Ai can be defined as follows.

$$Ai=(-1)^{INT(i-1)/2)}$$

When Ai=+1, a beam reflected by the i-th mirror proceeds on one side with respect to the central axis lx in the auxiliary scanning direction. When Ai=−1, the reflected beam proceeds on the other side with respect to the central axis lx. Further, given that the diameter of a beam is $\omega_0$ at the reference position (i.e., at the diffractive beam-dividing element 30) and the diameter of the beam at the i-th mirror is $\omega_i$, $\omega_0/\omega_i$ represents the magnification of the optical system from the reference position to the i-th mirror $4_i$. A product of $Ai \times \theta_i \times \omega_0/\omega_i$ represents degree of affection of the structure on the bending amount of the beam spot array. When the sum of the above product for each of the mirrors included in the converging optical system 40 is greater in a positive direction, the bent of the beam spot array is greater on one direction, while when the sum of the above product is negative and has a greater absolute value, the bent of the beam spot array is greater on the other direction. If sum is substantially equal to zero, the bent in both direction cancel with each other, and the beam spot array extends linearly.

That is, when the converging optical system 40 satisfies the condition expressed by equation (1) below, the beam spot array which are formed by the beams emerged from the converging optical system 40 and converged on the AOM 51, are aligned along a straight line.

$$\sum_{i=1}^{n} A_i \theta_i \frac{\omega_0}{\omega_i} = 0 \qquad (1)$$

If the above condition (1) is satisfied and the beam spots are linearly aligned at the AOM 51, since no curved surface mirrors are arranged on the downstream side of the converging optical system 40, the line, on which the beam spots are aligned, will not be bent. It should be noted that the condition (1) need not be precisely satisfied, but should merely be satisfied substantially. That is, a slight curvature of the alignment, which is negligible in view of the application of the multi-beam optical system 1000, is allowable.

Hereinafter, four numerical embodiments will be described.

1st Numerical Embodiment

FIG. 5 shows the arrangement, viewed along the auxiliary scanning direction, of the three mirrors, i.e., the first mirror $4_1$, the second mirror $4_2$ and the third mirror $4_3$, according to the first numerical embodiment. In this numerical embodiment, all the mirrors $4_1$, $4_2$ and $4_3$ incline in the same direction. FIG. 6 is a developed view of the arrangement shown in FIG. 5, where the central axis lx is shown as a straight line.

The inclination angles $\theta_1$, $\theta_2$ and $\theta_3$ of the first, second and third mirrors $4_1$, $4_2$ and $4_3$ are +5°, +5° and +10°, respectively. The focal lengths $F_1$, $F_2$ and $F_3$ of the first, second and third mirrors $4_1$, $4_2$ and $4_3$ are the same, which is 120 mm. If the diameter $\omega_0$ of the beam at the reference position is represented by 1 (one), the diameter $\omega_1$ of the beam at the first mirror $4_1$ is 1 (i.e., equal to $\omega_0$), the diameter $\omega_2$ of the beam at the second mirror $4_2$ is 1 (i.e., equal to $\omega_0$) and the diameter $\omega_3$ of the beam at the third mirror $4_3$ is also 1 (i.e., equal to $\omega_0$).

TABLE 1 shows the parameters, i.e., the coefficient $A_1$–$A_3$, the inclination angles $\theta_1$–$\theta_3$, and the diameters $\omega_1$–$\omega_3$ according to the first numerical embodiment.

TABLE 1

|  | Ai | θi | ωi |
|---|---|---|---|
| First Mirror $4_1$ | +1 | +5° | 1 |
| Second Mirror $4_2$ | +1 | +5° | 1 |
| Third Mirror $4_3$ | −1 | +10° | 1 |

With the values indicated in TABLE 1, condition (1) is satisfied. Therefore, the beam spots are aligned linearly on the objective surface S.

2nd Numerical Embodiment

FIG. 7 shows the arrangement, viewed along the auxiliary scanning direction, of the three mirrors, i.e., the first mirror $4_1$, the second mirror $4_2$ and the third mirror $4_3$, according to the second numerical embodiment. In this numerical embodiment, all the mirrors $4_1$, $4_2$ and $4_3$ incline in the same direction. FIG. 8 is a developed view of the arrangement shown in FIG. 7, where the central axis lx is shown as a straight line.

The inclination angles $\theta_1$, $\theta_2$ and $\theta_3$ of the first, second and third mirrors $4_1$, $4_2$ and $4_3$ are +5°, +5° and +7.5°, respectively. The focal lengths $F_1$, $F_2$ and $F_3$ of the first, second and third mirrors $4_1$, $4_2$ and $4_3$ are 120 mm, 60 mm and 120 mm, respectively. If the diameter $\omega_0$ of the beam at the reference position is represented by 1 (one), the diameter $\omega_1$ of the beam at the first mirror $4_1$ is 1 (i.e., equal to $\omega_0$), the diameter $\omega_2$ of the beam at the second mirror $4_2$ is 0.5 (i.e., $\omega_0 \times F_2/F_1$) and the diameter $\omega_3$ of the beam at the third mirror $4_3$ is also 0.5 (i.e., equal to $\omega_2$).

TABLE 2 shows the parameters, i.e., the coefficient $A_1$–$A_3$, the inclination angles $\theta_1$–$\theta_3$, and the diameters $\omega_1$–$\omega_3$ according to the second numerical embodiment.

TABLE 2

|  | Ai | θi | ωi |
|---|---|---|---|
| First Mirror $4_1$ | +1 | +5° | 1 |
| Second Mirror $4_2$ | +1 | +5° | 0.5 |
| Third Mirror $4_3$ | −1 | +7.5° | 0.5 |

With the values indicated in TABLE 2, condition (1) is satisfied. Therefore, the beam spots are aligned linearly on the objective surface S.

3rd Numerical Embodiment

FIG. 9 shows the arrangement, viewed along the auxiliary scanning direction, of the three mirrors, i.e., the first mirror $4_1$, the second mirror $4_2$ and the third mirror $4_3$, according to the third numerical embodiment. In this numerical embodiment, all the mirrors $4_1$, $4_2$ and $4_3$ incline in the same direction. FIG. 10 is a developed view of the arrangement shown in FIG. 9, where the central axis lx is shown as a straight line.

The inclination angles $\theta_1$, $\theta_2$ and $\theta_3$ of the first, second and third mirrors $4_1$, $4_2$ and $4_3$ are +2.5°, +3.75° and +5°, respectively. The focal lengths $F_1$, $F_2$ and $F_3$ of the first, second and third mirrors $4_1$, $4_2$ and $4_3$ are 120 mm, 60 mm and 120 mm, respectively. If the diameter $\omega_0$ of the beam at the reference position is represented by 1 (one), the diameter $\omega_1$ of the beam at the first mirror $4_1$ is 1 (i.e., equal to $\omega_0$), the diameter $\omega_2$ of the beam at the second mirror $4_2$ is 0.5 (i.e., $\omega_0 \times F_2/F_1$) and the diameter $\omega_3$ of the beam at the third mirror $4_3$ is also 0.5 (i.e., equal to $\omega_2$).

TABLE 3 shows the parameters, i.e., the coefficient $A_1$–$A_3$, the inclination angles $\theta_1$–$\theta_3$, and the diameters $\omega_1$–$\omega_3$ according to the third numerical embodiment.

TABLE 3

|  | Ai | θi | ωi |
|---|---|---|---|
| First Mirror $4_1$ | +1 | +2.5° | 1 |
| Second Mirror $4_2$ | +1 | +3.75° | 0.5 |
| Third Mirror $4_3$ | −1 | +5° | 0.5 |

With the values indicated in TABLE 3, condition (1) is satisfied. Therefore, the beam spots are aligned linearly on the objective surface S.

4th Numerical Embodiment

FIG. 11 shows the arrangement, viewed along the auxiliary scanning direction, of the five mirrors, i.e., the first mirror $4_1$, the second mirror $4_2$, the third mirror $4_3$, a fourth mirror $4_4$ and a fifth mirror $4_5$ according to the fourth numerical embodiment. In this numerical embodiment, the mirrors $4_1$, $4_2$ and $4_4$ incline in the same direction, while the mirror $4_3$ and $4_5$ incline in the opposite direction. FIG. 12 is a developed view of the arrangement shown in FIG. 11, where the central axis lx is shown as a straight line.

The inclination angles $\theta_1$, $\theta_2$, $\theta_3$, $\theta_4$ and $\theta_5$ of the first through fifth mirrors $4_1$, $4_2$, $4_3$, $4_4$ and $4_5$ are +5°, +5°, −5°, +2.5° and −5°, respectively. The focal lengths $F_1$, $F_2$, $F_3$, $F_4$ and $F_5$ of the first through fifth mirrors $4_1$, $4_2$ and $4_3$ are 120 mm, 120 mm, 120 mm, 60 mm and 120 mm, respectively. If the diameter $\omega_0$ of the beam at the reference position is represented by 1 (one), the diameter $\omega_1$ of the beam at the first mirror $4_1$ is 1 (i.e., equal to $\omega_0$), the diameter $\omega_2$ of the beam at the second mirror $4_2$ is 1 (i.e., $\omega_0 \times F_2/F_1$), the diameter $\omega_3$ of the beam at the third mirror $4_3$ is 1 (i.e., equal to $\omega_2$), the diameter $\omega_4$ of the beam at the fourth mirror $4_4$ is 0.5 (i.e., $\omega_3 \times F_3/F_4$) and the diameter $\omega_5$ of the beam at the fifth mirror $4_5$ is 0.5 (i.e., equal to $\omega_4$).

TABLE 4 shows the parameters, i.e., the coefficients $A_1$–$A_5$, the inclination angles $\theta_1$–$\theta_5$, and the diameters $\omega_1$–$\omega_5$ according to the fourth numerical embodiment.

TABLE 4

|  | Ai | θi | ωi |
|---|---|---|---|
| First Mirror $4_1$ | +1 | +5° | 1 |
| Second Mirror $4_2$ | +1 | +5° | 1 |
| Third Mirror $4_3$ | −1 | −5° | 1 |
| Fourth Mirror $4_4$ | −1 | +2.5° | 0.5 |
| Fifth Mirror $4_5$ | +1 | −5° | 0.5 |

With the values indicated in TABLE 4, condition (1) is satisfied. Therefore, the beam spots are aligned linearly on the objective surface S.

According to the above-described embodiments, even if curved surface mirrors are used within an optical path between the diffractive beam-dividing element 30 to the objective surface S, by adjusting the inclination angles and/or magnifications (focal lengths) of the curved surface mirrors appropriately, the beam spots can be aligned along a straight line on the objective surface S.

It should be noted that, in the condition (1), diameters of beams are used instead of focal lengths of the curved surface mirrors. Therefore, the equation applies to a structure in which refractive lenses are included. In such a case, the number of the curved surface mirrors included in the converging optical system could be even.

Further, in the embodiments, an odd number of curved surface mirrors included in the converging optical system are arranged to satisfy the condition (1), and on the downstream side of the AOM 51, only refractive lenses are arranged. However, the invention is not limited to such a structure. Even when curved surface mirror(s) is employed on the downstream side of the AOM 51, the object of the present invention can be achieved if all the mirrors arranged on the upstream side of the polygonal mirror satisfy the condition (1).

The present disclosure relates to the subject matter contained in Japanese Patent Application No. HEI 11-362082, filed on Dec. 21, 1999, which is expressly incorporated herein by reference in its entirety.

What is claimed is:

1. A multi-beam optical system, comprising:
a light source that emits a light beam;
a beam-dividing element that divides the light beam emitted by said light source into a plurality of light beams which emanate therefrom at different angles, respectively;
a propagation optical system through which the divided light beams propagate, said propagation optical system including a plurality of curved surface mirrors; and
an image-forming optical system that forms a plurality of beam spots on an objective surface by converging the light beams propagated through said propagation optical system,
wherein said propagation optical system is configured to substantially satisfy a condition represented by an equation:

$$\sum_{i=1}^{n} A_i \theta_i \frac{\omega_0}{\omega_i} = 0,$$

wherein,
i represents a mirror number of said plurality of curved surface mirrors counted along a direction where the divided light beams propagate,
n represents the number of said plurality of curved surface mirrors,
θi represents an inclination angle of an optical axis of an i-th curved surface mirror with respect to a central axis of a rectilinearly proceeding beam which would not be deflected by said beam-dividing optical element and proceed rectilinearly,
Ai represents a coefficient for an i-th curved surface mirror, Ai being +1 when a particular beam of said divided light beams is on one side with respect to a central axis of said rectilinearly proceeding beam, Ai being −1 when the particular beam of said divided light beams is on the other side with respect to the central axis of said rectilinearly proceeding beam, $\omega_0$ is a diameter of the particular beam emerged from said beam-dividing optical element, and $\omega_i$ represents a diameter of the particular beam at said i-th curved surface mirror.

2. The multi-beam optical system according to claim 1, further comprising a scanning system that deflects said plurality of light beams converged by said propagation optical system to scan with respect to said objective surface.

3. The multi-beam optical system according to claim 2, said plurality of curved surface mirrors being arranged between said beam-dividing optical element and said scanning system.

4. The multi-beam optical system according to claim 3, wherein said scanning system includes a polygonal mirror.

5. The multi-beam optical system according to claim 1, wherein said propagation optical system further comprises a multi-channel modulator that independently modulates each of the light beams divided by said beam-dividing element, and wherein said plurality of curved surface mirrors are arranged between said beam-dividing element and said multi-channel modulator.

6. The multi-beam optical system according to claim 5, wherein said plurality of curved surface mirrors consist of an odd number of curved surface mirrors, each of said curved surface mirrors having a positive power.

7. The multi-beam optical system according to claim 6, wherein a distance between said beam-dividing optical system and a first mirror, which is arranged closest to said beam-dividing optical system, of said plurality of curved surface mirrors coincides with a focal length of said first mirror, and wherein a distance between an i-th curved surface mirror and an (i-1)-th mirror coincides with a sum of focal lengths of said i-th mirror and said (i-1)-th mirror.

8. The multi-beam optical system according to claim 7, wherein said beam-dividing optical element includes a diffractive beam-dividing element.

9. A multi-beam optical system, comprising:

a light source that emits a light beam;

a beam-dividing element that divides the light beam emitted by said light source into a plurality of light beams, which emanates therefrom at different angles, respectively;

a propagation optical system through which the divided light beams propagate, said propagation optical system including a plurality of curved surface mirrors; and an image-forming optical system that forms a plurality of beam spots on an objective surface by converging the light beams propagated through said propagation optical system, wherein said plurality of curved surface mirrors are arranged such that affection on an alignment of said beam spots due to arrangements of respective curved surface mirrors is accumulatively cancelled.

* * * * *